United States Patent [19]

Habeger, Jr. et al.

[11] Patent Number: 4,769,571

[45] Date of Patent: Sep. 6, 1988

[54] ULTRASONIC TRANSDUCER

[75] Inventors: Charles C. Habeger, Jr.; Willmer A. Wink, both of Appleton, Wis.

[73] Assignee: The Institue of Paper Chemistry, Appleton, Wis.

[21] Appl. No.: 90,574

[22] Filed: Aug. 28, 1987

[51] Int. Cl.[4] .......... H01L 41/08

[52] U.S. Cl. .......... 310/334; 310/800; 310/327; 73/644; 73/632

[58] Field of Search .......... 310/800, 334, 327; 73/644, 632

[56] References Cited

U.S. PATENT DOCUMENTS

| | | | |
|---|---|---|---|
| 4,383,194 | 5/1983 | Ohigashi et al. | 310/327 |
| 4,461,179 | 7/1984 | Holt | 310/800 |
| 4,549,107 | 10/1985 | Kaneko et al. | 310/327 |
| 4,627,138 | 12/1986 | Im | 310/800 |

*Primary Examiner*—Stewart J. Levy
*Assistant Examiner*—Robert P. Bell
*Attorney, Agent, or Firm*—Fitch, Even, Tabin & Flannery

[57] ABSTRACT

An ultrasonic transducer for coupling ultrasonic energy to a web-like porous sample includes a sample-contacting layer of soft neoprene, 5–15 durometer hardness, which conforms to the surface of the sample being tested when pressed thereagainst. A non-polarized backing layer of polyvinylidene fluoride eliminates reflections at the end of the transducer remote from the sample. A polystyrene impedance-matching layer is located between the sample-contacting and the backing layer to provide a low-loss, low-impedance coupling of ultrasonic energy to the sample-contactiong layer. A stack of two, and preferably four, metallized polyvinylidene fluoride films is located between the impedance-matching layer and the backing layer. The outer surfaces of the stack are grounded, while the inner surfaces are energized by the ultrasonic energy source. The outer layers are polarized in a first direction, opposite that of the polarization direction of the middle layer.

5 Claims, 1 Drawing Sheet

ULTRASONIC TRANSDUCER

BACKGROUND OF THE INVENTION

1. Field of the Invention

The present invention pertains to ultrasonic transducers, and in particular to ultrasonic transducers which couple energy into porous media.

2. Description of the Prior Art

Ultrasonics is being applied today in a wide variety of non-destructive and non-intrusive testing applications. For example, ultrasonic testing is playing an increasingly important role in the quality control of various manufactured products, and is especially useful for the continuous quality monitoring of web-like products such as paper, paperboard and other porous materials produced by the paper industry. For obvious reasons, the use of liquid or other non-solid coupling agents for coupling ultrasonic energy to porous paper products and the like is generally unacceptable. There still remains a need for improved ultrasonic transducers which effectively couple broad-band ultrasonic energy into low-impedance porous media without the use of coupling agents.

Standard ultrasonic transducers made from ceramic piezoelectrics, and coupled to a sample with epoxy or a viscous fluid are not acceptable for use with porous media for several reasons, apart from their lasting effect on the appearance and quality of a paper. Difficulties encountered with ceramic piezoelectrics arise from their relatively high mechanical impedance which renders insufficient the mechanical coupling of the transducer to a low-impedance sample. Further, ceramic piezoelectric transducers have high Q or quality factors, making broad band transducer design difficult. Further, epoxy and viscous fluid coupling agents, apart from their effect on the appearance of a porous media, can oftentimes have large effects on the mechanical properties of the media which the transducers are attempting to measure.

SUMMARY OF THE INVENTION

Accordingly, it is an object of the present invention to provide an ultrasonic transducer which couples broad-band ultrasonic energy into low-impedance porous media without the use of epoxy or viscous coupling agents.

These and other objects of the present invention which will become apparent from studying the appended description and drawings are provided in an ultrasonic transducer for coupling ultrasonic energy to a sample. The transducer has a sample-contacting layer made of soft neoprene which conforms to the surface of the sample being tested when pressed thereagainst. The transducer includes a non-polarized backing cylinder, and an impedance-matching layer in contact with the sample-contacting layer, and located between the sample-contacting layer and the backing cylinder. The sample-contacting layer, impedance-matching layer and backing cylinder each have a thickness greater than the wavelength of the excitation frequency. A stack of at least two polarized polyvinylidene fluoride films which are metallized on both surfaces is located between the impedance-matching layer and the backing cylinder. The top and bottom layers of the stack have opposing polarization directions. The metallized surfaces at the center of the stack are made the active electrode, while the outer film surfaces are grounded. Ultrasonic energy is thus transmitted between the stack of films through the impedance-matching and sample-contacting layers to the sample being tested.

BRIEF DESCRIPTION OF THE DRAWINGS

In the drawings, wherein like elements are referenced alike.

DETAILED DESCRIPTION OF THE PREFERRED EMBODIMENT

Figure 1:
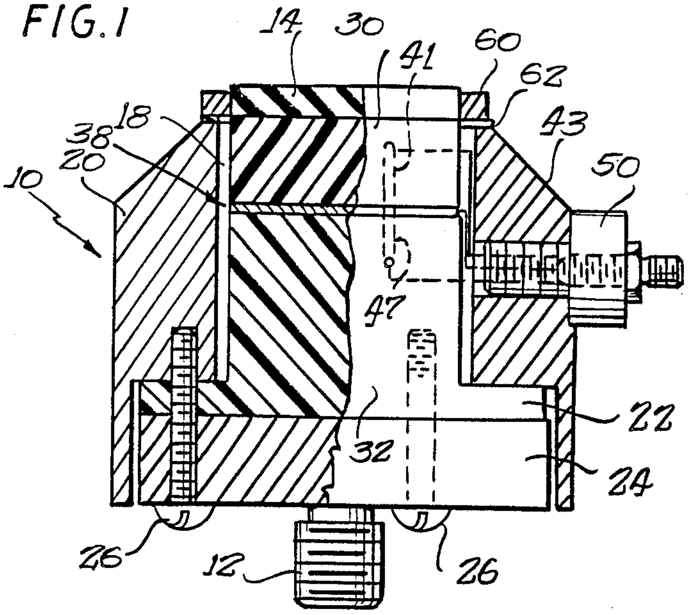
FIG. 1 is an elevational view, partially broken away, of an ultrasonic transducer illustrating features of the present invention.

Referring now to the drawings, the numeral 10 refers generally to an ultrasonic transducer illustrating several aspects of the present invention, which is particularly useful for coupling ultrasonic energy into and out of porous media, such as paper products or the like. The transducer 10 is comprised, generally, of four different layers, and is mounted by a threaded stud 12 to a suitable support, one example of which comprises a rotating wheel which brings transducer 10 into contact with a web-like substrate passing under the transducer. For reasons to be described herein, the support for transducer 10 preferably biases the transducer toward the web-like sample so as to be pressed against an outer surface thereof. One aspect of the transducer according to the present invention is that ultrasonic energy is coupled into the sample without using epoxy or non-solid coupling agents between the transducer and the sample being tested. The preferred arrangement for providing this coupling is a soft rubber, sample-contacting layer 14, preferably formed of neoprene having a 5-15 durometer hardness. When pressed against the porous sample, the neoprene layer 14 conforms to the surface contour thereof, providing an intimate mechanical contact throughout its surface area. Preferably, the neoprene layer 14 has a cylindrical configuration for ease of manufacturing, as do the other layers and components of the transducer device. Other non-cylindrical configurations for the various components of the transducer, and for the neoprene layer 14 are, of course, possible.

The neoprene sample-contacting layer is at the outermost end of a stack of generally cylindrical layers, which are contained within the central bore 18 of a brass housing 20. The mounting block 24 is preferably made of brass, and includes a threaded stud 12 for attachment to a suitable support.

Figure 3:
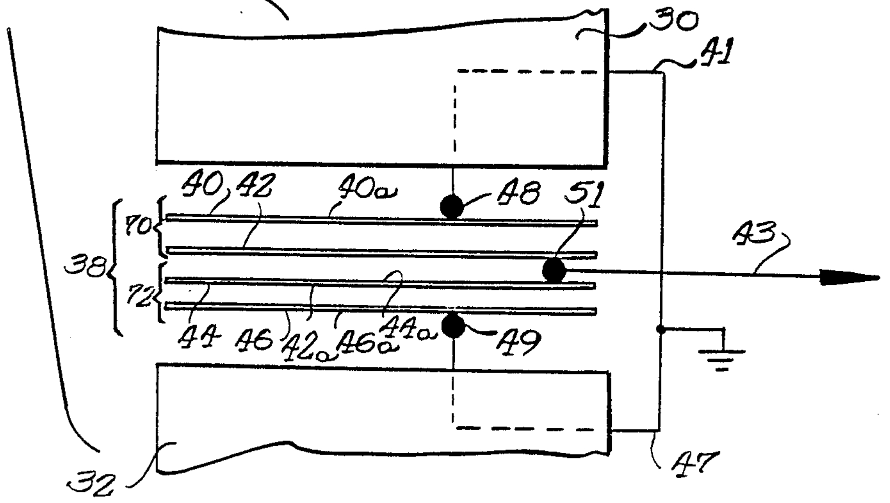
FIG. 3 is an enlarged, exploded fragmentary view of the transducer of FIG. 1 showing the electrode construction thereof in greater detail.

Located between the sample-contacting layer 14 and mounting block 24 is an impedance-matching layer 30 and a polyvinylidene fluoride cylinder 32 having an enlarged end 22, the functions of which will be discussed shortly. Referring especially to FIG. 3, a stack 38 of four polyvinylidene fluoride (PVDF) films 40, 42, 44 and 46 is located between the impedance-matching layer 30 and the backing cylinder 32. The films 40–46 are electrically connected to a source of ultrasonic energy in a manner to be described herein, to couple energy into and out of a sample. The films 40–46 comprising the stack 38 are preferably formed from polyvinylidene fluoride of the type polarized by applying a high voltage while the film is mechanically stretched. According to one aspect of the present invention, the upper two layers of film 40, 42, those closest the sample, are polarized in one direction, while the lower film layers 44, 46, are polarized in the opposite direction. The polarized polyvinylidene fluoride films are preferred for their very low mechanical impedance, which provides a more efficient coupling of ultrasonic energy into the sample, and a very low quality factor which, in combination with good acoustic match at the back side of the transducer, provides a practical realization of a broad band transducer.

Figure 2:
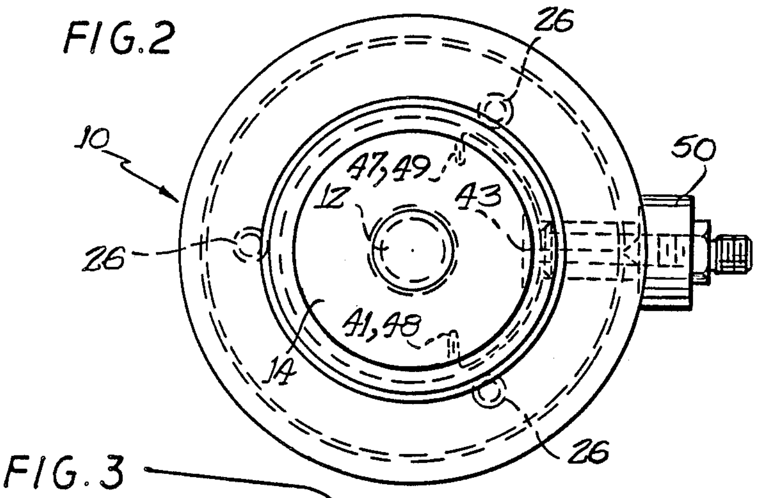
FIG. 2 is a top plan view of the transducer of FIG. 1.

The surfaces of the film layers are metallized for electrical connection to an ultrasonic energy source. The outer film surfaces 40*a*, 46*a* of the layers 40, 46 are grounded through leads 41, 47, respectively. The electrical lead 41 is attached at a point along the outer periphery of the upper surface 40*a* of film 40, preferably using conductive epoxy 48. The lead 41 extends in an axial direction toward the sample contact layer 14 and is routed around the impedance-matching layer 30 until it reaches a point axially adjacent a connector 50 mounted in housing 20. The surface 46*a* of the opposite film layer 46 is connected in a similar manner with conductive epoxy 49 through electrical lead 47 which extends in an opposing axial direction so as to form a generally right angle with the film stack 38. The free end of lead 47 is connected to a point on the outer periphery of film layer 46, generally opposite the connection point of electrical lead 41. As is seen most clearly in FIG. 2, the connection points 48, 49 for leads 41, 47 are not arranged diametrically opposite each other, but rather are located to one side of the film stack 38 adjacent connector 50. A center lead 43 is joined by epoxy 51 to opposing metallized surfaces 42*a*, 44*a* of opposing central film layers 42, 44 so as to be electrically connected thereto. The central lead 43 is connected to the active lead of the connector 50. The arrangement of multiple film layers, the outer layers of which are grounded, is preferred, according to one aspect of the present invention, to provide improved electrical insulation.

The film stack 38 is preferably constructed by using conductive opoxy to secure the lowermost film layer 46 to the backing cylinder 32. Thereafter, the succeeding film layers 40–44 are likewise adhesively fastened onto their succeeding film layer. Thus, film layer 44 is next secured to the film layer 46 with conductive epoxy. The film stack 38 is compressed prior to curing of the various conductive epoxy layers so as to provide an intimate engagement among the film layers of the stack 38. According to one aspect of the present invention, the films are joined together to form two pairs 70, 72, with the outer (i.e., major) surfaces of all film layers being metallized. The films 40, 42, in effect, form a single thicker layer of PVDF material, as do the films 44, 46.

With assembly of the film stack 38 completed, the impedance-matching layer 30 is affixed to the outermost film layer 40 with conductive epoxy. Thereafter, the soft neoprene contact layer 14 is attached to the impedance-matching layer 30 with adhesive.

According to one aspect of the present invention, the surface-contacting, impedance-matching, and backing layers 14, 30, 32, respectively, each have a thickness greater than one longitudinal wavelength at an excitation frequency of 1.0 MHz. According to this aspect of the invention, a single pulse can be isolated in the received signal, without interference from multiple reflections in the transducer interfaces among the various layers of the transducer. Accordingly, cross-correlation techniques can be used to establish a time-delay difference between a sample and a thin aluminum foil.

According to one feature of the present invention, a layer 30, as pointed out above, is constructed of polystyrene material. The polystyrene material is positioned to interface with the front face of the transducer stack, the sample-contacting soft rubber layer 14. The polystyrene material of layer 30 is chosen to provide a low-loss, or intermediate impedance between the neoprene and PVDF layers.

According to another aspect of the present invention, the backing layer 32 is preferably made of non-polarized polyvinylidene fluoride material in order to eliminate reflections off the back side of the transducer, that side remote from the sample being tested.

The sample-contacting soft rubber layer 14 is made thick enough to contain a single ultrasound pulse, so as to allow a full pulse to be coupled to the sample without interference from the signals reflected at the interfaces to layer 14, namely the interface with the sample being tested and the interface with the adjacent impedance-matching layer 30. As indicated above, the transducer 10 is preferably biased or pressed against the surface of the sample being tested to press the soft rubber layer into good ultrasound-coupling engagement with a sample. To preclude the soft rubber layer 14 from exerting excessive lateral forces of the sample as it deforms under pressure, a retaining ring 60 is arranged to surround the rubber layer 14, thereby limiting its lateral growth. Preferably, the retaining ring 60 is made of brass, and is mounted to the housing 20 with a thin cork ring 62 which provides a mounting of limited resilience while providing mechanical isolation between the retaining ring 60 and the housing 20.

By the way of example only, in one embodiment of the present invention, the layers 14, 30 and 32 of the transducer are generally one inch in diameter. The soft, rubber contacting layer 14 is preferably $\frac{1}{8}$ inch thick, while the impedance-matching layer 30 is $\frac{3}{8}$ inch thick and the polyvinylidene fluoride backing layer 32 is $\frac{7}{8}$ inch thick. The films 40–46, also of polyvinylidene fluoride material, are each 110 micrometers thick. The films of the preferred embodiment are made from Kynar film material, commercially available from the Pennault Corporation. If desired, the film layers could be made from films thicker than 110 micrometers. A preferred embodiment using thicker films, has a stack of only two films of opposite polarization directions, with each film metallized on both of its major surfaces. The opposing metallized surfaces are connected to the ultrasonic energy source, while the outer surfaces of the stack are grounded. All other features are as described above.

It can thus be seen that the present invention provides a broad band non-ceramic ultrasonic transducer having low impedance and low Q or quality factor which efficiently couples ultrasound energy into and out of low impedance porous media without the use of epoxy or other non-solid coupling media.

It will thus be seen that the objects hereinbefore set forth may readily and efficiently be attained and, since certain changes may be made in the above construction and different embodiments of the invention without departing from the scope thereof, it is intended that all matter contained in the above description or shown in the accompanying drawings shall be interpreted as illustrative and not in a limiting sense.

What is claimed is:

1. An ultrasonic transducer for coupling ultrasonic energy to a sample, comprising:

a sample-contacting layer of soft neoprene which conforms to the surface of the sample being tested when pressed thereagainst, and having a thickness greater than the wavelength of the excitation frequency;

a non-polarized backing cylinder having a thickness greater than the wavelength of an excitation frequency of the ultrasonic energy;

an impedance-matching layer of thickness greater than one wavelength at the excitation frequency, in contact with said sample-contacting layer, between said sample-contacting layer and said backing cylinder; and a stack of at least two polyvinylidene fluoride films between said impedance-matching layer and said backing cylinder, one outer film of said stack having a first polarization direction and means for electrical connection to a source of the ultrasonic energy and the other film of said stack having an opposite polarization direction and means for electrical connection to the source of ultrasonic energy whereby ultrasonic energy is transmitted from said stack of films through said impedance-matching and sample-contacting layers into and out of the sample being tested.

2. The transducer of claim 1 wherein said stack comprises four films, with two films at one end of the stack having a first polarization direction, and the remaning two films at the other end of the stack having a second polarization direction.

3. The transducer of claim 1 wherein said outer films of said stack and electrically grounded, through electrical leads extending through said impedance-matching and backing layers.

4. The transducer of claim 1 further comprising a stop member adjacent said sample-contacting layer, and having a greater resistance to compressing deformation than said sample-contacting layer so as to limit the compression thereof as said ultrasonic transducer is pressed against said sample.

5. The transducer of claim 1 wherein said sample-contacting layer has a hardness ranging between 5 and 15 durometer rating units.

* * * * *

UNITED STATES PATENT AND TRADEMARK OFFICE

CERTIFICATE OF CORRECTION

PATENT NO. : 4,769,571

DATED : September 6, 1988

INVENTOR(S) : Charles C. Habeger, Jr., et al.

It is certified that error appears in the above-identified patent and that said Letters Patent is hereby corrected as shown below:

Abstract, line 11, change "contactiong" to --contacting--.

Column 1, line 32, change "insufficient" to --inefficient--.

Column 3, line 43, change "opoxy" to --epoxy--.

Column 4, line 4, change "a" to --the--.

line 36, after "By" delete "the".

Column 6, line 7, change "remaning" to --remaining--.

line 11, change "and" to --are--.

Signed and Sealed this

Twenty-first Day of February, 1989

*Attest:*

DONALD J. QUIGG

*Attesting Officer*

*Commissioner of Patents and Trademarks*